(12) United States Patent  
Del Monte

(10) Patent No.: US 8,284,293 B2  
(45) Date of Patent: Oct. 9, 2012

(54) IMAGE SENSORS WITH GRADED REFRACTIVE INDEX MICROLENSES

(75) Inventor: Andrea Del Monte, Pomezia (IT)

(73) Assignee: Aptina Imaging Corporation, George Town (KY)

( * ) Notice: Subject to any disclaimer, the term of this patent is extended or adjusted under 35 U.S.C. 154(b) by 21 days.

(21) Appl. No.: 12/831,552

(22) Filed: Jul. 7, 2010

(65) Prior Publication Data

US 2012/0008039 A1    Jan. 12, 2012

(51) Int. Cl.
*H04N 5/232* (2006.01)
*G03B 13/00* (2006.01)

(52) U.S. Cl. ......... 348/345; 348/335; 348/340; 348/348

(58) Field of Classification Search .................. 348/335, 348/340, 345, 348; 438/7, 24, 48
See application file for complete search history.

(56) References Cited

U.S. PATENT DOCUMENTS

| 6,821,810 B1 | 11/2004 | Hsiao | |
| 7,009,772 B2 | 3/2006 | Hsiao | |
| 7,264,976 B2 * | 9/2007 | Deng et al. | 438/7 |
| 7,317,579 B2 | 1/2008 | Li | |
| 2006/0138481 A1 * | 6/2006 | Suzuki | 257/291 |
| 2007/0243669 A1 * | 10/2007 | Suzuki et al. | 438/142 |

* cited by examiner

*Primary Examiner* — Yogesh Aggarwal
(74) *Attorney, Agent, or Firm* — Treyz Law Group; G. Victor Treyz; Nancy Y. Ru

(57) ABSTRACT

An image sensor has an array of image sensor pixels. Each image sensor pixel may have a gradient index lens formed in a passivation layer. The gradient index lens may be a converging or diverging gradient index lens. The gradient index lens may have a gradient index profile that is smooth or a gradient index profile having distinct regions of lower or higher refractive index. Regions of lower refractive index may be formed from ion implantation in the passivation layer. Each pixel may also have a polymer microlens, a color filter, a dielectric stack, and a photosensitive element in a substrate.

18 Claims, 8 Drawing Sheets

IMAGE SENSORS WITH GRADED REFRACTIVE INDEX MICROLENSES

BACKGROUND

This relates to image sensors and, more particularly, to image sensors with passivation layers that have radially-varying refractive index profiles.

Digital cameras are often provided with digital image sensors such as CMOS (complementary metal-oxide-semiconductor) image sensors. Digital cameras may be stand-alone devices or may be included in electronic devices such as cellular telephones or computers. A typical CMOS image sensor has an array of image sensor pixels containing contain thousands or millions of pixels. Lenses focus incoming light onto the array of pixels. Each pixel typically has a microlens for focusing light onto a photosensitive element such as a photodiode. Layers such as a dielectric stack, a passivation layer, and a color filter layer may be located between the microlens and photodiode. Metal interconnects and vias can be formed in the metal and dielectric layers of the dielectric stack. The passivation layer can be formed above the dielectric stack. A color filter layer can contain filters for filtering light of different colors.

Image sensor performance is influenced by the efficiency with which image sensor pixels gather light. An image sensor could have better performance if light were focused more precisely onto each pixel's photosensitive element. Improved pixel structures may therefore be desired for focusing light within an image sensor pixel.

DETAILED DESCRIPTION

Figure 1:
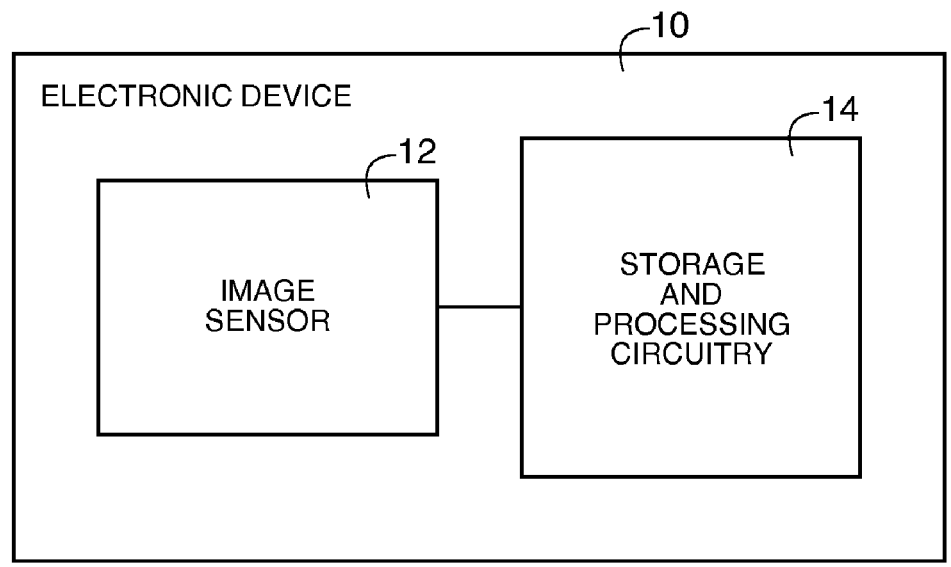
FIG. 1 is a diagram of an illustrative electronic device with an image sensor that may be provided with a graded index lens in accordance with an embodiment of the present invention.

Digital image sensors are widely used in digital cameras and in electronic devices such as cellular telephones, computers, and computer accessories. An illustrative electronic device 10 with an image sensor 12 and storage and processing circuitry 14 is shown in FIG. 1. Electronic device 10 may be a digital camera, a computer, a computer accessory, a cellular telephone, or other electronic device. Image sensor 12 may be part of a camera module that includes a lens or may be provided in a more complex electronic device that has a separate lens. During operation, the lens focuses light onto image sensor 12. Image sensor 12 may also be known as an image sensor array. Image sensor 12 may have an array of image sensor pixels, containing photosensitive elements such as photodiodes that convert light into digital data. Image sensors may have any number of pixels (e.g., hundreds, thousands, millions, or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc.

The quality of the images that are captured by image sensor 12 is influenced by a variety of factors. For example, the quality of the lens that is used to focus image light onto the image sensor may have an impact on image quality. The size of the pixel array in image sensor 12 may also have an impact on image quality. Large image sensors with large numbers of image pixels will generally be able to produce images with higher quality or resolution than smaller image sensors having fewer image pixels. Image quality is also affected by the performance of the individual pixels in the image array. Image arrays with poorly designed image pixels will not be efficient at collecting light and converting the collected light into electrical signals.

Figure 2:
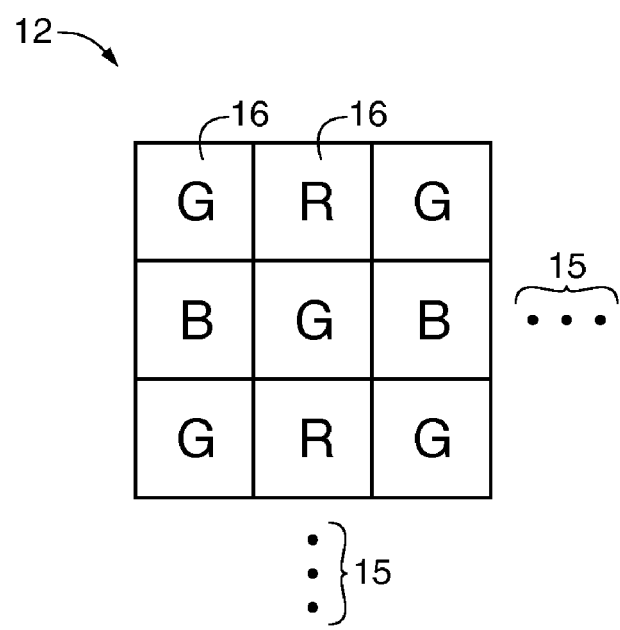
FIG. 2 is a diagram of an illustrative color filter array having a Bayer pattern that may be included in an image sensor array in accordance with an embodiment of the present invention.

An illustrative image sensor array 12 is shown in FIG. 2. As shown in FIG. 2, sensor 12 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals). A typical pixel may include a microlens and a color filter. The microlens in a pixel receives light from the main lens in the electronic device and focuses the light onto the photosensitive element of the pixel through the color filter. There are typically color filter elements of several different colors in the color filter. For example, image sensors such as in the example of FIG. 2 that are based on the well-known Bayer pattern contain red (R), green (G), and blue (B) color filters. Pixels having such color filters may be known as red pixels, green pixels, and blue pixels, respectively. In a Bayer pattern, half of the rows (e.g., the odd rows) contain alternating green (G) and red (R) color filters and the other half of the rows (e.g., the even rows) contain alternating green and blue (B) color filters. Only nine pixels are shown in the example of FIG. 2, but in general, pixel array 12 may have millions of pixels, as denoted by dots 15.

Figure 3:
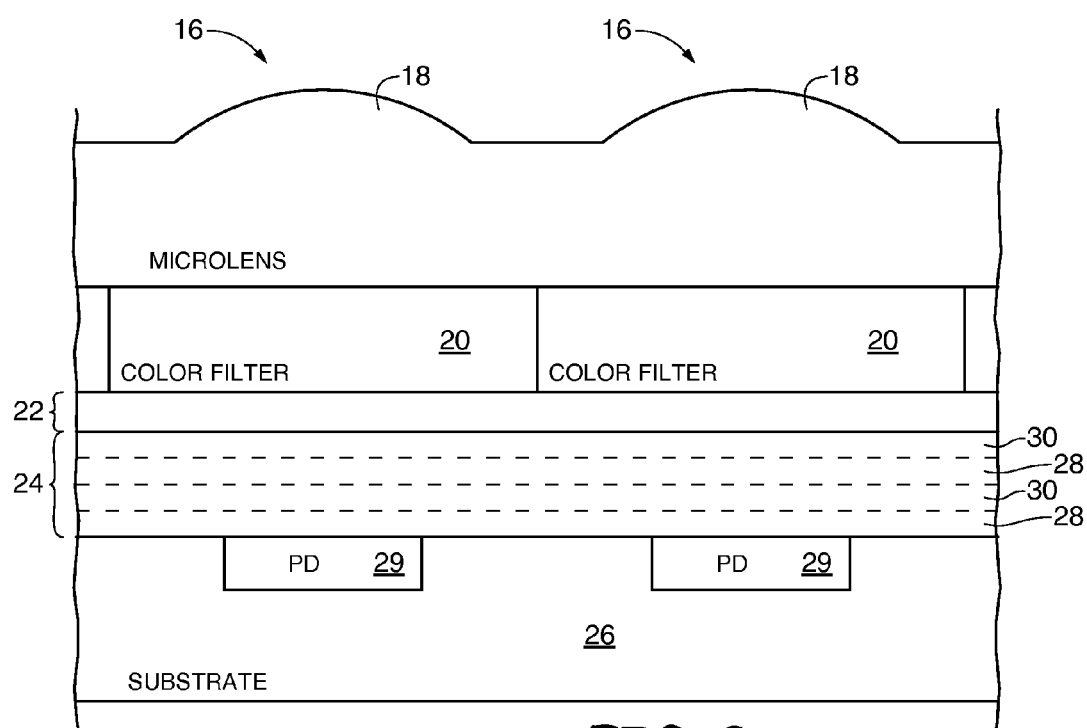
FIG. 3 is a cross sectional diagram of a conventional image sensor.

FIG. 3 is a cross-sectional diagram of conventional image sensor pixels. Image sensor pixels 16 of FIG. 3 are formed on semiconductor substrates such as silicon wafers. Pixels 16 have photosensitive elements 29 (photodiodes) that are formed in substrate 26. Dielectric stack 24 is formed above photodiodes 29 on the surface of substrate 26. Dielectric stack 24 contains alternating metal layers 28 and via layers 30. Metal interconnect lines are formed in metal layers 28. Via layers 30 have conductive vertical conductors (vias) that electrically connect metal interconnects in adjacent metal layers. The pattern of metal lines in the dielectric stack can be configured so as not to significantly impede light that is being focused onto photosensitive elements 29.

A passivation layer 22 such as a layer of silicon nitride is formed at the top of dielectric stack 24. Color filters 20 are formed on top of passivation layer 22. Color filters 20 filter light of specific wavelengths. In a Bayer pattern filter array, color filters 20 may be red, blue, and green. Microlenses 18 are formed above color filters 20. During operation of the image sensor, incoming light is focused by each microlens 18 onto the surface of a corresponding photosensitive element 29. Microlenses 18 may be formed from polymer.

The performance of an image sensor may be improved if incoming light were more efficiently or precisely focused onto the photosensitive elements of each image sensor pixel. This can be accomplished by providing layers such as a passivation layer in image sensors with a graded refractive index (index of refraction) profile.

A passivation layer may be provided with a refractive index profile that is radially-varying within each image sensor pixel. A refractive index profile may have a higher index of refraction at the center of a pixel and a lower index of refraction at the peripheries of a pixel. Such a refractive index profile can form a converging gradient index lens for the pixel. If desired, a passivation layer may also have a refractive index profile that is lower at the center of a pixel and higher near the periphery of the pixel. A passivation layer having such a gradient index profile may form a diverging index lens for the pixel.

A desired refractive index profile for a passivation layer may be formed by processes such as ion implantation. For example, regions of lower refractive index may be ion-implanted with dopant while regions of higher refractive index regions may be left unimplanted. Alternatively, regions of lower refractive index regions may be ion-implanted using different process parameters than regions of higher refractive index regions. Any suitable variation of process parameters may be used to form a graded refractive index in a passivation layer. A graded index lens may also be formed in other layers of an image sensor pixel, such as in layers of a dielectric stack, or in a silicon oxide layer.

Figure 4:
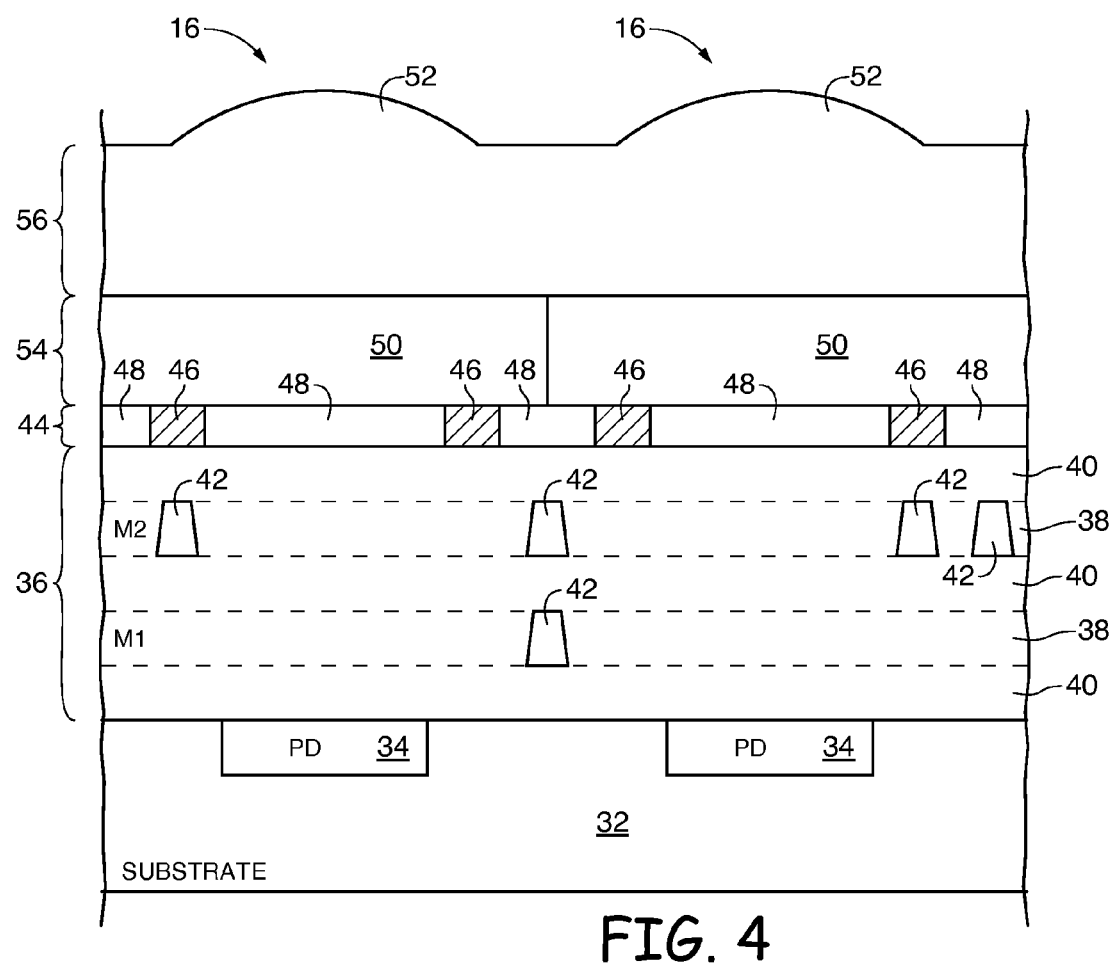
FIG. 4 is a cross sectional diagram of an illustrative image sensor having a passivation layer with a graded refractive index in accordance with an embodiment of the present invention.

FIG. 4 is a cross-sectional view of pixels 16 that may be provided with gradient index lenses. A gradient index lens (also known as a gradient index microlens or a graded index microlens) may be formed for each pixel in passivation layer 44. Passivation layer 44 may be formed from silicon nitride, silicon oxide, silicon oxide nitride, or other suitable materials. Passivation layer 44 may be provided with a radially-varying refractive index profile. Passivation layer 44 may have ring-shaped implanted regions such as regions 46 that are formed from ion implantation. Any suitable ions may be used for ion implantation (e.g., boron, arsenic, phosphorus, gallium, or any suitable ions). Implanted regions 46 may have a lower index of refraction than unimplanted regions 48, providing passivation layer 44 with a graded refraction index. For example, implanted regions 46 may have an index of refraction of 1.7 while unimplanted regions 48 may have an index of refraction of 2.0. For such an example, passivation layer 44 would act as a converging lens and may add to the focusing power of each microlens 58. If desired, more rings of different index values can be provided in each microlens. Continuously graded index profiles may be implemented by using implant masks of varying thickness. In general, passivation layer 44 may be formed with any suitable refractive index profile. Passivation layer 44 may have a thickness of less than 2000 angstroms, more than 2000 angstroms, less than 4000 angstroms, or other suitable thickness.

Color filter layer 54 and its color filters 50 may be formed above passivation layer 44. Color filters 50 may be arranged in a Bayer pattern with red, green, and blue pixels, such as in the example of FIG. 2. If desired, color filters 50 may also be arranged in other patterns and have other colors, such as cyan, yellow, magenta, or other suitable colors. Microlens layer 56 and its associated microlenses 58 may be formed above color filters 50. Dielectric stack 36 may have alternating metal layers 38 and via layers 40. Metal lines 42 may be formed in metal layers 38 (such as metal layer M1 and metal layer M2) and may be positioned so that metal lines 42 do not obstruct light passing from microlenses 52 to photosensitive elements 34 (photodiodes) in substrate 32. Vias in via layers 30 may connect metal lines 42 in adjacent metal layers 38. If desired, light guide structures may be formed in dielectric layers 36 for additional focusing power. Photosensitive elements 34 (photodiodes) may be formed in substrate 32. Substrate 32 may be a silicon substrate.

If desired, gradient refractive lenses may be formed in other layers of pixels 16. For example, gradient refractive lenses may be formed in metal layers 38 or vias layers 40 of dielectric stack 36. Any suitable processes may be used to form a gradient refractive index in these layers. Ion implantation or other suitable processes may be used.

Figure 5:
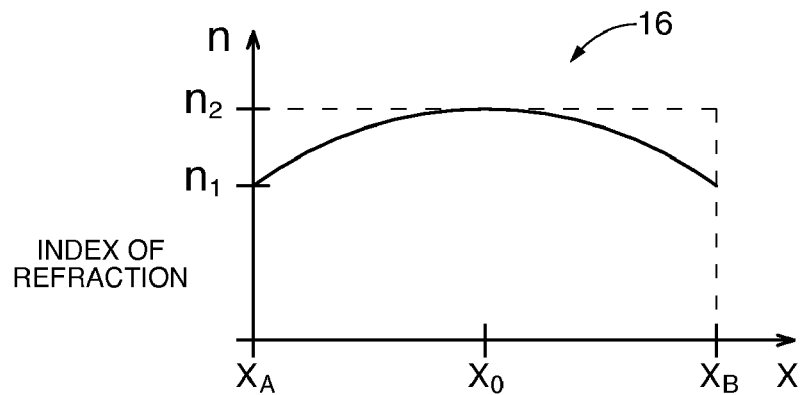
FIG. 5 is a diagram of an illustrative refractive index profile having smooth contours in accordance with an embodiment of the present invention.

FIG. 5 is an example of a refractive index profile that may be used for passivation layer 44. A refractive index profile may be radially-varying, such that the refractive index at the center of a pixel (e.g., at point $x_0$ on FIG. 5) may have a certain value and the refractive index may change a function of distance from the center of the pixel. The refractive index may have circular symmetry. If the edges of the pixel (e.g., points $x_A$ and $x_B$) are equidistant from the center $x_0$, then the edges (e.g., points $x_A$ and $x_B$) may have the same refractive index value. In the example of FIG. 5, the refractive index profile varies continuously and monotonically from the center of pixel 16 to the edges $x_A$ and $x_B$ of pixel 16. The refractive index profile of FIG. 5 has its highest value at center $x_0$ with a value of $n_2$ and decreases radially, reaching a lower value of $n_1$ at peripheral locations $x_A$ and $x_B$ of pixel 16. A passivation layer having the refractive index profile of FIG. 5 may form a gradient index lens for pixel 16. A passivation layer having a radially-decreasing refractive index, such as the example of FIG. 5, may form a positive (or converging) gradient index lens for pixel 16. Such a refraction index profile may aid in focusing light rays onto photosensitive elements such as photosensitive elements 34 in FIG. 4. A gradient index lens may have any values of refractive index. For example, a refractive index profile may have a maximum refractive index that is 2 or less, less than 2.2, less than 2.5, etc. A refractive index profile may have a minimum refractive index that is greater than 1.3, greater than 1.5, greater than 1.7, etc.

Passivation layer 44 may also be formed having a refractive index profile that is not as smoothly varying as the refractive index profile of FIG. 5. For example, for ease of manufacture, passivation layer 44 may be formed with distinct regions, in which each region has an associated refractive index.

Figure 6A:
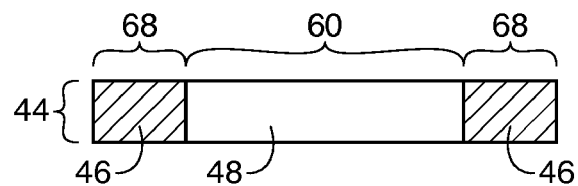
FIG. 6A is a diagram of an illustrative passivation layer having two refractive index regions in accordance with an embodiment of the present invention.
Figure 6B:
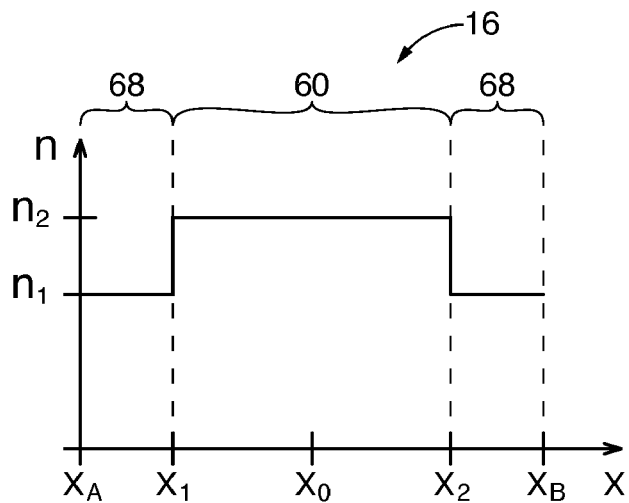
FIG. 6B is a diagram of an illustrative refractive index profile for the passivation layer in FIG. 6A in accordance with an embodiment of the present invention.

FIGS. 6A and 6B show an example of a refractive index profile with distinct (stepped) refractive index regions that may be provided for passivation layer 44. Passivation layer 44 in FIG. 6A has a central region 48 and a peripheral region 46. Regions 48 and 46 may be formed by ion implantation. If desired, one of regions 46 and 48 may be formed by ion implantation while the other of regions 46 and 48 may be left unimplanted. Peripheral region 46 may be ion-implanted while center region 48 may be unimplanted. Dopant may be used to either raise or lower the refractive index of the implanted portion.

FIG. 6B shows a possible refractive index profile for passivation layer 44 of FIG. 6A. The refractive index profile of FIG. 6B may be a radially-varying refractive index profile with two distinct regions. The refractive index may have substantially the same value within each region. Center region 60 may have refractive index $n_2$ and peripheral region 68 may have refractive index $n_1$. Center region 60 having refractive index $n_2$ may be substantially circular in shape. Peripheral region 68 may be concentric with center region 60. The boundaries between center region 60 and peripheral region 68 may be located at $x_1$ and $x_2$. The center $x_0$ of pixel 16 may be equidistant between $x_1$ and $x_2$. Center region 60 may have a higher refractive index than that of peripheral region 68. A passivation layer having the refractive index profile of FIG. 6B may serve as a convergent gradient index lens for pixel 16. Passivation layer 44 of FIG. 6A may be also formed with a center region 60 with a lower refractive index than peripheral region 46, in which case passivation layer 44 may form a diverging gradient refractive lens for image pixel 16. The gradient index profile of FIG. 6B and the gradient index regions of FIG. 6A may also be formed in a layer such metal layer 38 or via layer 40 (see, e.g., FIG. 4).

Figure 7:
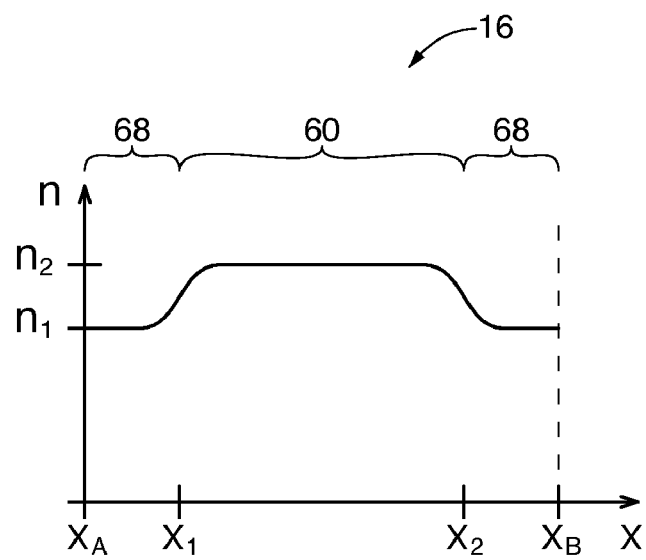
FIG. 7 is a diagram of an illustrative refractive index profile having smooth gradations in accordance with an embodiment of the present invention.

FIG. 7 is a diagram of another possible refractive index profile for passivation layer 44. Passivation layer 44 may have gradual boundaries between center region 60 and peripheral region 68 (e.g., due to thermal treatment and dopant diffusion following implantation). Peripheral region 68 may be an ion-implanted region and center region 60 may be an unimplanted region. The diffraction profile of FIG. 7 has a center region 60 at refractive index $n_2$ and a peripheral region 68 at refractive index $n_1$. There may be a gradual slope at the boundaries between center region 60 and peripheral region 68, instead of a sharp boundary as shown in the example of FIG. 6B. Refractive index $n_2$ may be greater than refractive index $n_1$ to form a converging gradient index lens. A refractive index profile as shown in FIG. 7 may be formed in passivation layer or in a metal layer 38 or via layer 40 of FIG. 4

Figure 8:
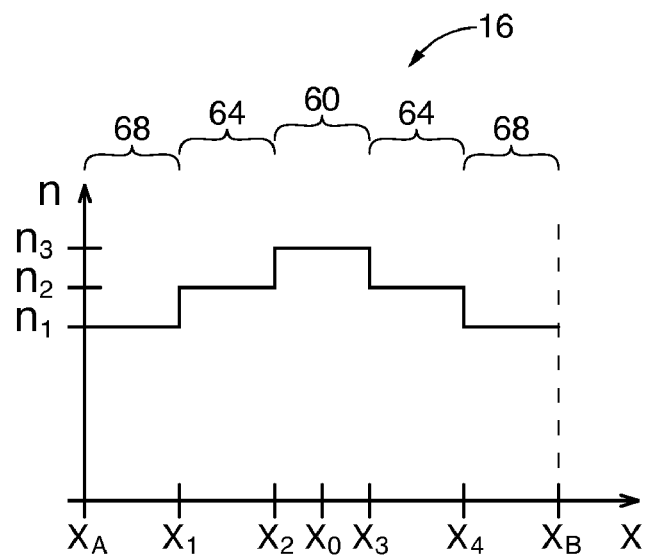
FIG. 8 is a diagram of an illustrative refractive index profile having three refractive index regions that may be provided for a passivation layer in accordance with an embodiment of the present invention.

FIG. 8 is a diagram of a refractive index profile having three distinct refractive index values. Center region 60 may be a circular region around center $x_0$ of pixel 16. Region 64 may be an intermediate region surrounding center region 60. Region 64 may be substantially ring shaped. Peripheral region 68 may surround region 64. Center region 60 may have a higher refractive index $n_3$, peripheral region may have a lower refractive index $n_1$, and intermediate region 64 may have an intermediate refractive index $n_2$. The refractive index profile of FIG. 8 may be a refractive index profile for a converging lens. Boundaries between center region 60 and intermediate region 64 (e.g., at $x_2$ and $x_3$) and boundaries between intermediate region 64 and peripheral region 68 (e.g., at $x_1$ and $x_4$) may be sharp boundaries or gradual boundaries such as in the example of FIG. 7. Any suitable processes may be used to create the graded refractive index profile of FIG. 7. Center region 60 may be an unimplanted region in passivation layer 44. Intermediate region 64 may be an ion-implanted region in passivation layer 44. Peripheral region 68 may be an ion-implanted region in passivation layer 44 that is more heavily implanted than intermediate region 64 or implanted with different ions than intermediate region 64. If desired, other suitable parameters of ion implantation or other processes may be adjusted to create the refractive index profile of FIG. 8. If desired, passivation layer 44 may be formed with more than three distinct refractive index regions. Passivation layer 44 may also be formed having a center region that has a lower refractive index than peripheral regions. Such a passivation layer may serve as a negative (diverging) gradient index lens for pixel 16. Refractive index profiles such as in FIG. 8 may also be formed in metal layer 38 or via layer 40 (see, e.g., FIG. 4).

Figure 9:
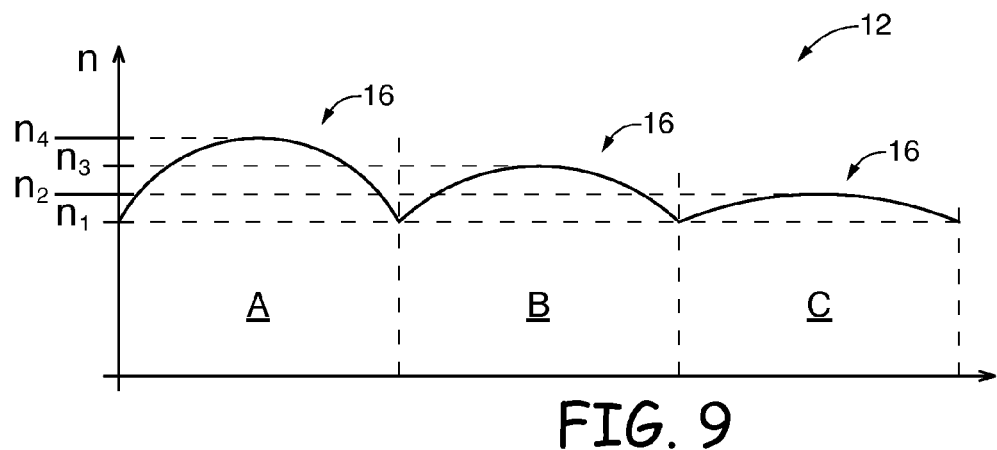
FIG. 9 is a diagram of illustrative refractive index profiles that may be provided for a passivation layer in an image sensor array in accordance with an embodiment of the present invention.

Passivation layers 44 may be formed with refractive index profiles that are the same for all pixels 16 in image sensor array 12 (e.g., image sensor array 12 of FIG. 2). If desired, passivation layer 44 may also be formed with refractive index profiles that vary amongst pixels 16 in image sensor array 12. FIG. 9 is an example of refractive index profiles that are different in different pixels 16. In the example of FIG. 9, pixel A has a maximum refractive index of $n_4$, whereas pixel B has a maximum refractive index of $n_3$ and pixel C has a maximum refractive index of $n_2$. Passivation layer 44 may also be formed such that different pixels 16 have different minimum refractive indices, such as when passivation layer 44 forms negative (diverging) gradient index lenses. Passivation layer 44 may also be formed having a converging gradient index lens in some pixels and a diverging gradient index lens in other pixels. Pixels of different colors may be provided with different refractive index profiles. For example, by use of appropriate photolithographically defined ion implantation masks, a passivation layer may be provided with a certain refractive index profile for red pixels and another refractive index profile for blue pixels, and so on. If desired, gradient index profiles in other layers of pixel 16 (such as metal or via layers) may also be different for different pixels.

Figure 10:
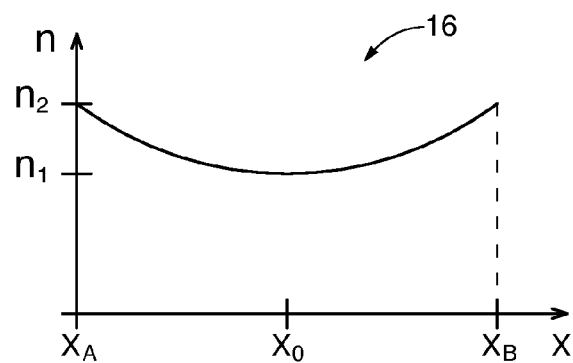
FIG. 10 is a diagram of an illustrative diverging refractive index profile that may be provided for a passivation layer in accordance with an embodiment of the present invention.

FIG. 10 is an example of a refractive index profile having a minimum at the center $x_0$ of pixel 16. In the example of FIG. 10, center $x_0$ has a refractive index of $n_2$ that is lower than a refractive index $n_1$ at the periphery of pixel 16. Passivation layer 44 having the refractive index profile of FIG. 10 would serve as a negative (diverging) gradient index lens for pixel 16. Any suitable process may be used to form the gradient index profile of FIG. 10 in passivation layer 44. Negative gradient index profiles of FIG. 10 may be formed having smooth contours or could be formed with distinct steps between regions of different refractive indices.

Figure 11:
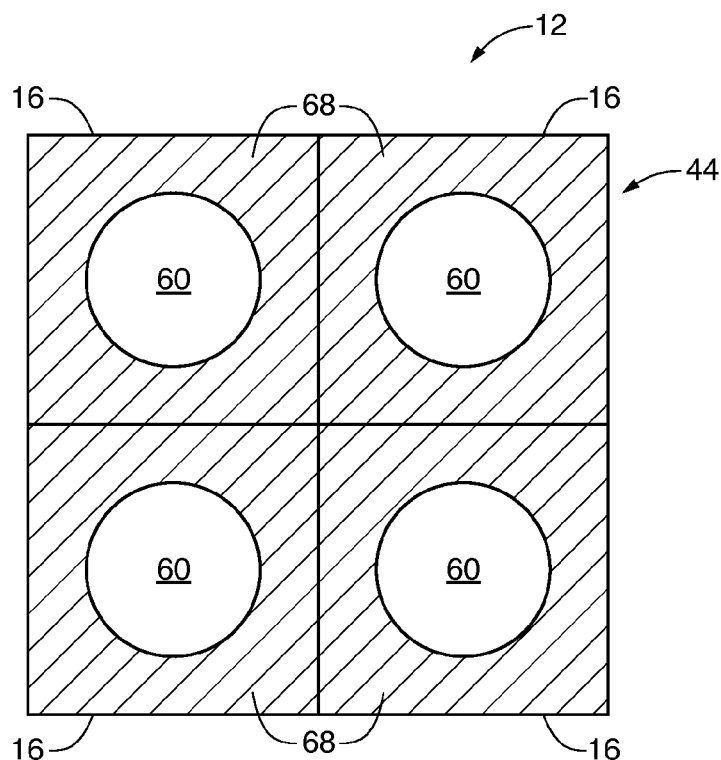
FIG. 11 is a diagram of an illustrative passivation layer having a graded refractive index that may be provided for an image sensor array, in which the passivation layer in each image sensor pixel has a center region and a peripheral region in accordance with an embodiment of the present invention.

FIG. 11 is a top view of a possible arrangement for passivation layer 44 in image sensor array 12, such as passivation layer 44 of FIG. 6A. Passivation layer 44 of FIG. 11 may have a center region 60 and a peripheral region 68. Peripheral region 68 may be ion-implanted while center region 60 could be unimplanted. Center regions 60 may be circular regions in the center of each pixel 16. Implanted region 68 may fill the area between center regions 60. Implanted region 68 may have a higher or lower refractive index than center regions 60. In FIG. 11, four pixels 16 of image sensor array 12 are shown. In general, there may be millions of pixels 16 in image sensor array 12.

Figure 12:
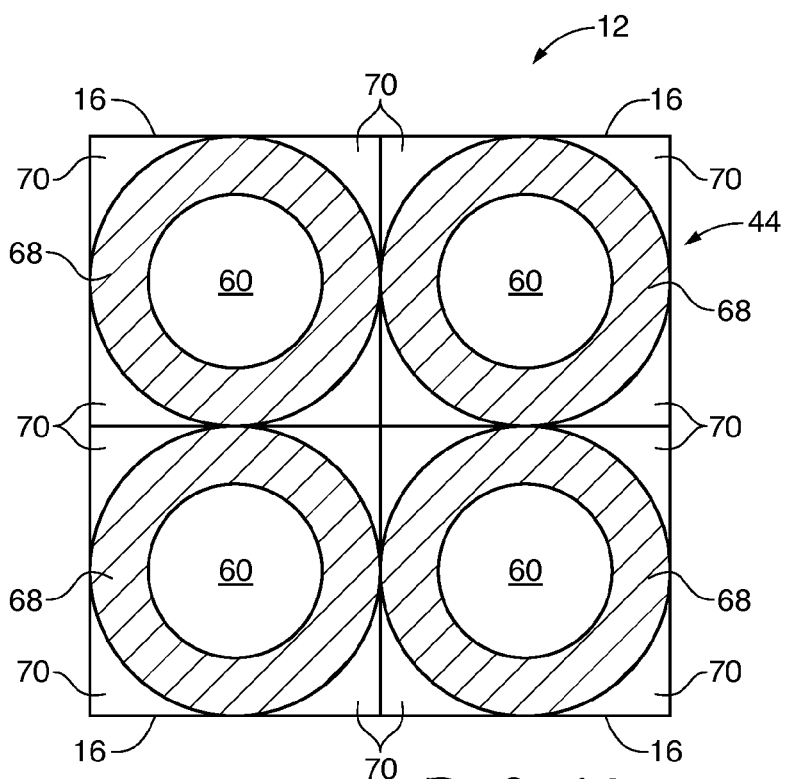
FIG. 12 is a diagram of an illustrative passivation layer having a graded refractive index that may be provided for an image sensor array, in which the passivation layer in each image sensor pixel has a center region and a substantially ring-shaped peripheral region in accordance with an embodiment of the present invention.

FIG. 12 is a top view of another arrangement for passivation layer 44 of FIG. 6A. Center region 60 may be a circular region in the center of each pixel 16. Region 68 may be a ring-shaped region around each center region 60. Region 68 may be an ion-implanted region. Region 68 may have a lower or higher refractive index than center region 60. Regions 70 in the corners of the pixels 12 may be implanted or unimplanted. Microlenses 52 (see, e.g., FIG. 4) may focus light onto passivation layer 44 so that all or most of the light falls on regions 60 and 68.

Figure 13:
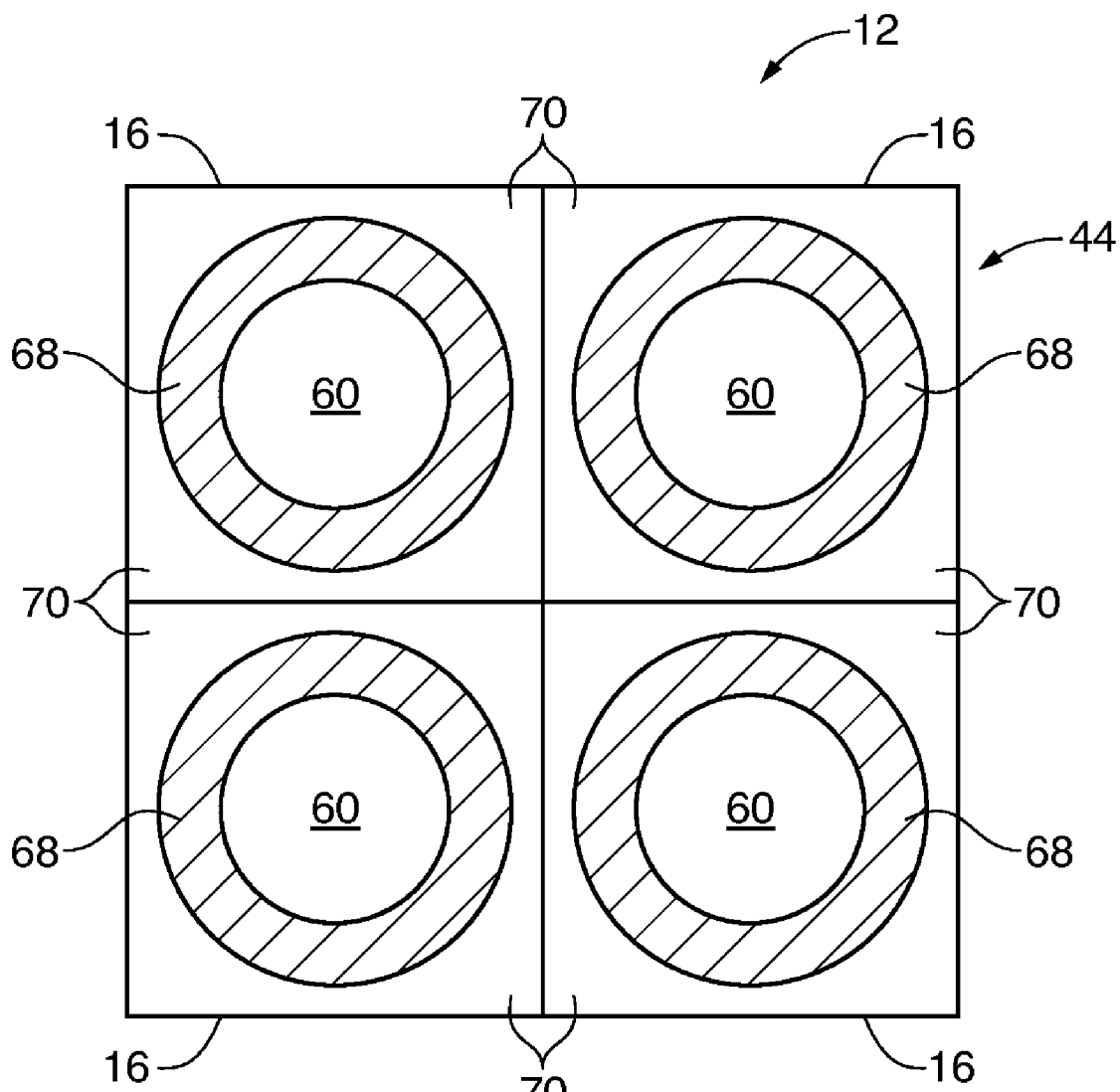
FIG. 13 is a diagram of an illustrative passivation layer having a graded refractive index that may be provided for an image sensor array, in which the passivation layer in each image sensor pixel has a center region and a substantially ring-shaped peripheral region that are located away from the pixel perimeters in accordance with an embodiment of the present invention.

FIG. 13 is a top view of another arrangement for passivation layer 44 of FIG. 6A. In the example of FIG. 14, passivation layer 44 may receive light from microlenses 52 (see, e.g., FIG. 4) that falls on regions 60 and 68. Edge and corner regions 70 may receive less light. Regions 70 may be implanted or unimplanted.

Gradient index lenses may also be formed in other layers in an image sensor array. For example, gradient index lenses may be formed in metal layers such as metal layers 38 of dielectric stack 36 (see, e.g., FIG. 4). Microlenses 52 (see, e.g., FIG. 4) may be optional when gradient index lenses are included in pixels 16.

Various embodiments have been described illustrating an electronic device with image sensor pixels having gradient index lenses. Gradient index lenses may be formed in passivation layers of each pixel.

An image sensor array may have pixels containing photosensitive elements such as photodiodes. The photodiodes may be formed in substrates. Dielectric layers may be formed above the photodiodes. A passivation layer may be formed above the dielectric layers. Color filters may be formed above the passivation layer. Microlenses may be formed above the color filters.

A passivation layer may be provided with a refractive index profile that is radially-varying within each image sensor pixel. A refractive index profile may have a higher index of refraction at the center of a pixel and a lower index of refraction at the periphery of a pixel, which may form a converging gradient index lens for the pixel. If desired, a passivation layer may have a refractive index profile that is lower at the center of a pixel and higher near the periphery of the pixel, which may form a diverging index lens for the pixel.

A passivation layer may be formed from silicon nitride, silicon oxide, silicon oxide nitride, or other suitable materials. A desired refractive index profile for a passivation layer may be formed by processes such as ion implantation. For example, regions of lower refractive index may be ion-implanted with dopant while regions of higher refractive index regions may be left unimplanted. Alternatively, regions of lower refractive index regions may be ion-implanted using different process parameters than regions of higher refractive index regions. Any suitable variation of process parameters may be used to form a graded refractive index in a passivation layer.

Passivation layers may have a refractive index profile that is continuously varying or a refractive index profile that is discontinuous (stepped). Passivation layers may be formed with a circular center region of one refractive index and a ring-like periphery region of another refractive index. Boundaries between regions of differing refractive index may be smooth or sharp.

The foregoing is merely illustrative of the principles of this invention which can be practiced in other embodiments.

What is claimed is:

1. An image sensor pixel, comprising:
   a photodiode in a substrate;
   a microlens; and
   a gradient index lens formed in a passivation layer between the photodiode and the microlens, wherein the passivation layer has a center region and a peripheral region, and wherein the peripheral region comprises an ion-implanted region.

2. The image sensor pixel defined in claim 1, wherein the pixel has a center and wherein the gradient index lens comprises a converging gradient index lens.

3. The image sensor pixel defined in claim 1, wherein the center region has a first refractive index, wherein the peripheral region has a second refractive index, and wherein the first refractive index is greater than the second refractive index.

4. The image sensor pixel defined in claim 1, wherein the gradient index lens comprises a diverging gradient index lens.

5. The image sensor pixel defined in claim 1, wherein the passivation layer is formed from silicon nitride.

6. The image sensor pixel defined in claim 1, wherein the passivation layer is formed from silicon oxide nitride.

7. An array of image sensor pixels, wherein each image sensor pixel comprises:
   a photodiode in a substrate;
   a microlens; and
   a gradient index lens between the photodiode and the microlens, wherein the gradient index lens has a radially-varying refractive index profile provided by implanted ions.

8. The array of image sensor pixels defined in claim 7, wherein the refractive index profile is the same for each image sensor pixel in the array.

9. The array of image sensor pixels defined in claim 7, wherein the gradient index lens in at least one of the image sensor pixels comprises a converging gradient index lens.

10. The array of image sensor pixels defined in claim 7, wherein the refractive index profile in a first set of the image sensor pixels in the array is different from the refractive index profile in a second set of the image sensor pixels in the array.

11. The array of image sensor pixels defined in claim 7, wherein the gradient index lens is formed in a passivation layer.

12. The array of image sensor pixels defined in claim 7, wherein the gradient index lens in at least one of the image sensor pixels comprises a diverging gradient index lens.

13. The array of image sensor pixels defined in claim 7, wherein the microlens comprises polymer.

14. The array of image sensor pixels defined in claim 7, wherein each image sensor pixel comprises a color filter between the microlens and the gradient index lens.

15. An array of image sensor pixels, wherein each image sensor pixel comprises:
   a graded index microlens formed in a passivation layer; and
   a photosensitive element that receives light through the graded index microlens, wherein the graded index microlens in the passivation layer has a substantially ring-shaped region having implanted ions.

16. The array of image sensor pixels defined in claim 15, wherein each of the graded index microlenses has an associated refractive index profile that is radially varying.

17. The array of image sensor pixels defined in claim 16, wherein the refractive index profile has a maximum refractive index that is less than 2.

18. The array of image sensor pixels defined in claim 15, wherein the substantially ring-shaped region has an associated refractive index and wherein the graded index microlens has a center region having an associated refractive index that is greater than the associated refractive index of the substantially ring-shaped region.

* * * * *